United States Patent [19]

Bretl

[11] Patent Number: 4,517,533
[45] Date of Patent: May 14, 1985

[54] INTEGRATED CRYSTAL VCO
[75] Inventor: Wayne E. Bretl, Schaumburg, Ill.
[73] Assignee: Zenith Electronics Corporation, Glenview, Ill.
[21] Appl. No.: 545,803
[22] Filed: Oct. 26, 1983
[51] Int. Cl.³ .............................................. H03B 5/00
[52] U.S. Cl. ................................ 331/116 R; 331/158; 331/177 R
[58] Field of Search ............. 331/116 R, 116 FE, 158, 331/160, 177 R

[56] References Cited

U.S. PATENT DOCUMENTS 3,839,685 10/1974 Borsa et al. .................. 331/116 R X
4,484,157 11/1984 Helle et al. ...................... 331/116 R Primary Examiner—Eugene R. LaRoche
Assistant Examiner—Robert J. Pascal

[57] ABSTRACT

An integrated crystal voltage controlled oscillator (VCO) with only two terminals for the crystal network and no additional terminals for decoupling, bypass capacitors, etc., as well as no internal capacitors is disclosed. A negative feedback loop having both AC and DC gain for increased amplification stability as well as a separate positive feedback path having little or no DC gain but sufficient AC gain at the desired oscillating frequency to compensate for the negative feedback are provided in the crystal VCO which is capable of low voltage, e.g., 5 VDC, and high frequency, i.e., greater than 10 MHz, operation and thus is particularly adapted for digital applications utilizing emitter coupled logic (ECL).

13 Claims, 2 Drawing Figures

INTEGRATED CRYSTAL VCO

BACKGROUND OF THE INVENTION

This invention relates generally to voltage controlled oscillators and is directed to a voltage controlled oscillator particularly adapted for implementation in integrated circuit form.

A voltage controlled oscillator (VCO) is an oscillator whose frequency is proportional to an externally applied voltage. VCO's are perhaps most commonly utilized in RF phase locked loop (PLL) tuning systems. When the phase locked loop is locked on an incoming periodic signal, the VCO frequency is exactly equal to that of the incoming signal. If the frequency of the incoming signal shifts slightly, the phase difference between the VCO signal and the incoming signal will begin to increase with time. This will result in a change in the control voltage applied to the VCO in such a way as to bring the VCO frequency back to the same value as the incoming signal. Thus, the phase locked loop maintains lock when the input frequency changes and the VCO input voltage is proportional to the frequency of the incoming signal. This behavior makes PLL's particularly useful for the demodulation of frequency modulated (FM) signals, where the frequency of the incoming signal varies in time and contains the desired information.

A common prior art voltage feedback tuned oscillator consists of a transformer, a capacitor and a pair of transistors providing current paths for each half cycle of AC output. This form of tuned oscillator is simple and reliable. However, the tendency today is to provide VCO's in integrated circuit (IC) form which offers the advantages of reduced power consumption, smaller size, higher operating frequencies, and increased reliability. The tendency is to further simplify and reduce the cost of VCO IC's by reducing the number of pins associated therewith. For example, this type of VCO IC is typically driven by a crystal oscillator requiring various input pins to the VCO. By reducing the number of pins associated with the IC, its cost and complexity can be similarly reduced making it available for a greater variety of applications.

The present invention is intended to provide such a VCO IC which requires a minimum number of crystal oscillator input pins, is capable of operating at video frequencies greater than 10 MHz, and offers the advantages of AC signal amplification from a positive feedback path and DC bias stability from a separate negative feedback path without use of external decoupling components.

OBJECTS OF THE INVENTION

Accordingly, it is an object of the present invention to provide an improved crystal VCO particularly adapted for integrated circuit form.

It is another form of the present invention to provide a low voltage, high frequency VCO particularly adapted for digital applications.

Yet another object of the present invention is to provide a VCO having an AC signal amplification capability utilizing a positive feedback loop and DC bias stability by means of a negative feedback loop which does not require additional decoupling components.

Still another object of the present invention is to provide an integrated circuit VCO requiring only two external pins for the crystal network.

BRIEF DESCRIPTION OF THE DRAWINGS

The appended claims set forth those novel features believed characteristic of the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DESCRIPTION OF THE PREFERRED EMBODIMENT

Figure 1:
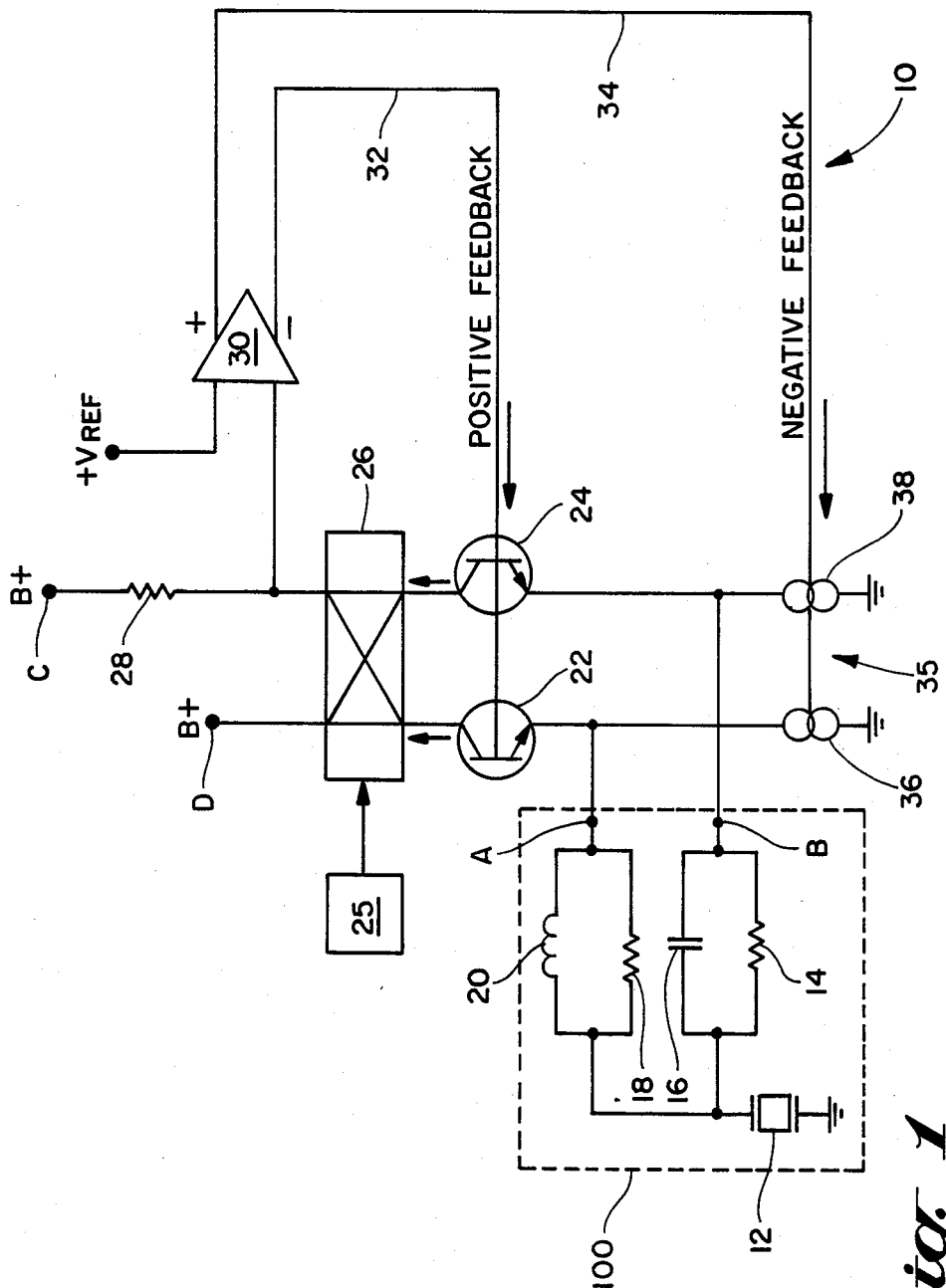
FIG. 1 shows in simplified block and schematic diagram form a crystal voltage controlled oscillator in accordance with the present invention.

Referring to FIG. 1, there is shown in simplified schematic and block diagram form an integrated crystal voltage controlled oscillator (VCO) 10 in accordance with the present invention. The integrated crystal VCO 10 includes a pair of terminals A, B for coupling the VCO to a crystal 12 via an external network. A series-resonant crystal 12 is preferred in combination with the present invention, although a "parallel" resonant crystal can be used equally as well if the appropriate capacitor is placed in series with the crystal 12. The following detailed description of the present invention is provided for operation in combination with a series-resonant crystal 12.

The external network is comprised of a first parallel arrangement of resistor 14 and capacitor 16 coupled to terminal B and a second parallel arrangement of resistor 18 and inductor 20 coupled to terminal A. Terminal A is, in turn, coupled to the emitter of NPN transistor 22, while terminal B is coupled to the emitter of NPN transistor 24. The values of inductor 20 and capacitor 16 are selected so as to be resonant at the crystal oscillator frequency, $\omega_0$. The crystal 12 thus sees a resistive source comprised of resistor 14 in parallel with resistor 18. The reactive current thus flowing through this external network is provided in a differential mode through transistors 22 and 24 which are driven in parallel by the output 32 of the amplifier 30 and thus have the same emitter voltage.

Coupled to the respective collectors of transistors 22 and 24 is a current steering network 26 which, in turn, is coupled to a steering control voltage source 25 and is responsive to a direct voltage output therefrom for controlling the frequency of oscillation of the integrated crystal VCO 10. A direct voltage provided from steering control voltage source 25 to the current steering network 26 permits the current steering network 26 to select part of the current flowing through transistor 22 and part of the current flowing through transistor 24 in establishing the oscillating frequency of the crystal VCO. The positive feedback portion of the currents in transistors 22, 24 is provided via feedback path 32 to the bases of transistors 22 and 24 which allows steering network 26 to derive part of the current therethrough from the network comprised of resistor 18 and inductor 20 and part of its current from the network comprised of resistor 14 and capacitor 16. The phase of the signal in the crystal VCO 10 at a particular frequency is determined by the crystal 12 and by the proportions of the inductive and capacitive current from inductor 20 and capacitor 16, respectively, which are steered to the feedback path by the current steering network 26. For oscillation to occur, there must be a net positive feedback with an open loop gain in excess of 1 and a phase shift of 0° (or 360°). The magnitude of this net positive gain is determined by the difference between the respective gains of the positive and negative feedback loops described below.

The steering network 26 in response to a direct voltage provided from the steering control voltage source 25 provides for controlling the frequency of oscillation of the integrated crystal VCO 10. The steering control voltage provided to the current steering network 26 is a constant DC voltage corresponding to a particular frequency of oscillation with the current steering network 26 selecting a portion of the current from transistor 24 and a complementary portion of the current from transistor 22 such that with the positive feedback path 32, part of the feedback current is from the resistor 18 and inductor 20 network and part of the feedback current is from the resistor 14 and capacitor 16 network. As stated earlier, it is the relative proportions of inductive and capacitive current from the aforementioned respective inductive and capacitive networks which determine the frequency of oscillation since oscillation will occur only when the phase shift around the loop is 0° (or 360°) for signal reinforcement.

The integrated crystal VCO 10 is coupled to a B+ source by means of terminals C and D, with terminal D providing a return path to the B+ source for the portion of current from transistors 22, 24 which is not steered to resistor 28. The current steering netwrk 26 provides the above mentioned proportion of currents from transistors 22, 24 to resistor 28 for driving differential amplifier 30. The voltage across resistor 28 which is provided as one input to differential amplifier 30 is referenced therein to a DC voltage, $+V_{REF}$, provided thereto.

The signal provided from the negative output terminal of differential amplifier 30 via the positive feedback path 32 is applied to the bases of transistors 22 and 24 and is comprised of both AC and DC components. The AC signal initiates oscillation within the integrated crystal VCO 10 and provides an open loop gain greater than 1 in order to sustain this oscillation. The AC positive feedback signal is amplified by virtue of the crystal network 100 coupled to the respective emitters of transistors 22 and 24 in establishing the oscillating frequency of the crystal VCO. The positive feedback path has little or no DC gain, due to the high DC impedance of crystal network 100 and current sources 36, 38. However, the AC gain therein is sufficient to counteract the negative feedback (described below) at the desired frequency of oscillation.

The positive output of differential amplifier 30 is provided via a negative feedback path 34 to a pair of current sources 36, 38 where it is inverted and provided via transistors 22 and 24 and the current steering network 26 to resistor 28 in producing a negative feedback voltage thereat. The negative feedback signal is comprised both of an AC and a DC component. The negative feedback signal is thus provided in common mode to transistors 22 and 24 such that the amount of negative feedback is unaffected by the action of steering network 26. Because of the low impedance at the emitters of transistors 22, 24, these transistors act as common-base (cascode) amplifiers for the negative feedback signals, and pass essentially all the negative feedback current (both DC and AC parts) from sources 36, 38 to the steering network 26. The total feedback current provided to resistor 28 then consists of the following parts:

(1) An AC part containing:
  (a) a portion of the positive feedback current developed through transistor 22 and crystal network terminal A;
  (b) a complementary portion of the positive feedback current developed through transistor 24 and crystal network terminal B; and
  (c) a negative feedback current developed by sources 36, 38;

(2) A DC part containing:
  (a) a negative feedback current developed by sources 36, 38; and
  (b) a negligible (essentially zero) positive feedback current (as explained above).

Oscillation occurs when the net AC loop gain is positive and greater than 1, i.e., the current of paragraph (1)(a) (above) plus the curent of paragraph (1)(b) minus the current of paragraph (1)(c) provides a net open loop gain greater than 1. At the same time, the net DC open loop gain is determined by current (2)(a) only, thus ensuring a net negative open-loop gain at DC, which stabilizes the circuit bias without use of additional decoupling components (or pin-outs, in the case of an integrated circuit design).

Figure 2:
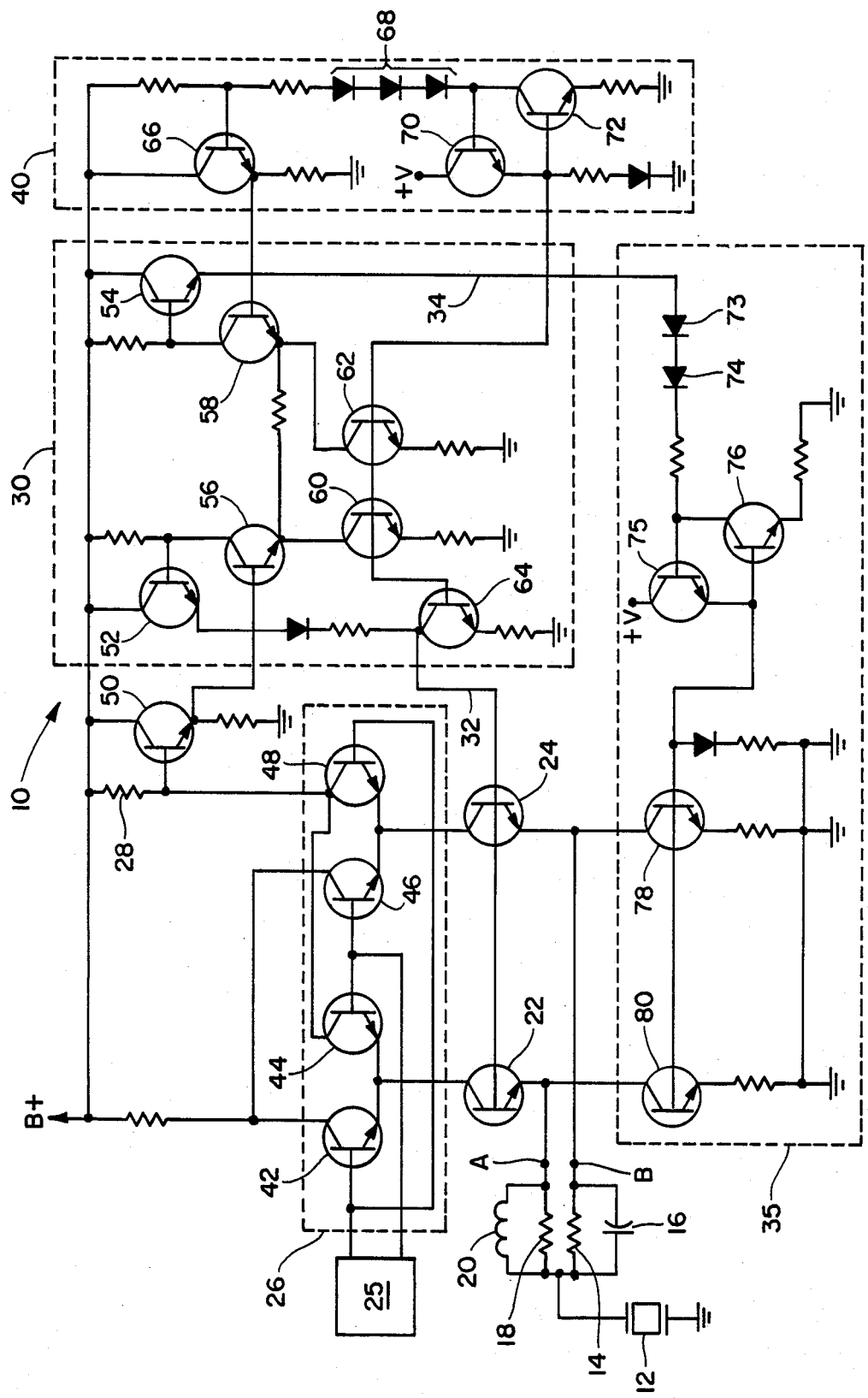
FIG. 2 is a schematic diagram of a preferred embodiment of the crystal voltage controlled oscillator of the present invention shown generally in FIG. 1.

Refering to FIG. 2, there is shown a detailed schematic of a preferred embodiment of the present invention. In a preferred embodiment, the current steering network 26 is comprised of a "steering quad" which includes two pairs of emitter-coupled NPN transistors 42, 44 and 46, 48. The respective outputs from these pairs of coupled transistors are derived from the collectors of transistors 44 and 48 and are provided via resistor 28 to an emitter follower NPN transistor 50. A B+ source is coupled to the respective collectors of transistors 42 and 46 in the current steering network 26. A constant DC voltage provided from steering control voltage source 25 to the respective bases of the transistors within the current steering network 26 results in a predetermined proportion of the signals in each emitter-coupled transistor pair being provided to resistor 28. The voltage across resistor 28 renders emitter follower transistor 50 conductive and provides one input to differential amplifier 30. The other input to differential amplifier 30 is provided from a biasing/temperature compensation network 40 to the base of transistor 58 in differential amplifier 30. NPN transistors 66, 70 and 72 in combination with serially coupled diodes 68 provide a level DC input to differential amplifier 30 for the proper biasing and temperature compensation thereof.

Differential amplifier 30 is comprised primarily of input buffer transistors 52, 54, emitter-coupled NPN transistors 56, 58 and current source transistors 60, 62. NPN transistors 64 provides for level shifting to provide a convenient DC level for transistors 22, 24 in the positive feedback path 32. The positive feedback path 32 is coupled to the negative output terminal of differential amplifier 30, while the negative feedback path 34 is coupled to the positive output terminal of differential amplifier 30.

As previously described, the positive feedback signal from differential amplifier 30 is provided to the respective bases of transistors 22 and 24 for providing a primarily AC feedback signal for signal amplification and VCO oscillation.

The positive output of differential amplifier 30 is provided via a negative feedback path 34 to a current source network 35. This positive output of differential amplifier 30 is inverted by a current mirror comprised primarily of diodes 73, 74, NPN transistors 75, 76, and NPN transistors 78, 80. Because the emitter impedance of transistors 22 and 24 is low compared to the impedance of the crystal network, the current passes through transistors 22 and 24 and produces a negative feedback voltage across resistor 28. The crystal network is thus transparent to the negative feedback path 34 because of the low impedance of transistors 22 and 24, while the positive feedback path 32 is responsive only to the crystal network because of the high impedance of transistors 78 and 80 and thus causes the oscillation of the crystal VCO 10. The current source network 35 thus converts the positive output of differential amplifier 30 to a current source for transistors 22 and 24 in providing a negative feedback signal thereto. The output from crystal VCO 10 may be taken at any number of points in the circuit such as at the collectors of transistors 22 and 24 or at the emitter of buffer transistor 50 or at the emitter of transistor 75, or differentially at the emitters of transistors 52, 54.

The positive and negative loop gains have been calculated and combined into net gains for the AC and DC cases. In these calculations, the phase angle was set equal to 0° corresponding to an oscillating state. From these positive and negative loop gain equations, equations for the frequency of oscillation may be derived. Thus, the tuning range, $\epsilon$, of the crystal VCO of the present invention is approximately given by the following expression:

$$\epsilon \cong (2-4K) \left( \frac{1 + R_A/2R_x}{Q_p + Q_x} \right) Q_p \qquad (1)$$

where

K is a control variable ranging from 0 to 1 representing the proportion of current respectively derived from transistor 22 or transistor 24 with K=0 representing the case where all current is derived from transistor 22 and K=1 representing the case where all current is derived from transistor 24;

$R_A$ is the value of resistor 14 or resistor 18;

$R_x$ is the equivalent resistance of the crystal 12; and $$Q_p = \frac{R_A}{2\omega_o L} ; \qquad (2)$$

$$Q_x = \frac{\omega_o L_x}{R_x} ; \qquad (3)$$

and where $\omega_o$ is the frequency of crystal 12;

L is the value of inductor 20; and $L_x$ is the equivalent inductance of crystal 12.

From equation (1), the tuning range of the crystal VCO can be determined by substituting therein values for the various system parameters defined above.

There has thus been shown an integrated crystal voltage controlled oscillator with only two pin-outs for an associated crystal oscillator network, and no additional terminals for decoupling, bypass capacitors, or other external components. In addition, no internal capacitors are required in the voltage controlled oscillator of the present invention which is capable of operating at low voltages, e.g., 5 VDC, over the entire range of video frequencies, i.e., up to 10 MHz. Separate positive and negative feedback loops are provided in the voltage controlled oscillator for respectively providing sufficient AC gain for large signal amplification as well as sufficient combined AC/DC gain for signal amplification stability.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. An integrated voltage controlled oscillator coupled to a variable control voltage source for changing the frequency of oscillation thereof and coupled to a crystal network, said voltage controlled oscillator comprising:

first and second terminals coupled to said crystal network;

first and second conducting means respectively coupled to said first and second terminals;

a current source coupled to said first and second terminals and to said first and second conducting means;

a current steering network coupled to said control voltage source and to said first and second conducting means for alternately directing a signal through said first and second conducting means in establishing the oscillating frequency of said voltage controlled oscillator;

a positive feedback path coupled between said first and second conducting means and said current steering network for generating a first amplifying signal for amplifying the output of said voltage controlled oscillator and for establishing the oscillation thereof; and a negative feedback path coupled between said current source and said current steering network for generating a second stabilizing signal for stabilizing the thus amplified output of said voltage controlled oscillator.

2. A voltage controlled oscillator in accordance with claim 1 wherein said positive and negative feedback paths include a differential amplifier for amplifying the output of said current steering network and wherein said current steering output is provided via said positive feedback path to said first and second conducting means and said output is provided in opposite polarity via said negative feedback path to said current source.

3. A voltage controlled oscillator in accordance with claim 1 further including a direct voltage source coupled to said current steering network for controlling said voltage controlled oscillator.

4. A voltage controlled oscillator in accordance with claim 1 wherein said current steering network includes first and second pairs of coupled transistors respectively coupled to said first and second conducting means and rendered conductive by said direct voltage source for proportionally conducting signals from said first and second conducting means.

5. A voltage controlled oscillator in accordance with claim 1 wherein said first and second conducting means include respective first and second transistors.

6. A voltage controlled oscillator in accordance with claim 5 wherein said first and second transistors are NPN transistors with the respective bases thereof coupled to said positive feedback path, the respective emitters thereof coupled to said first and second terminals, respectively, and the respective collectors thereof coupled to said current steering network.

7. A voltage controlled oscillator in accordance with claim 1 wherein the crystal network comprises a crystal, an inductive network coupling the crystal to the first terminal and a capacitive network coupling the crystal to the second terminal.

8. A voltage controlled oscillator in accordance with claim 7 wherein the capacitance of said capacitive network and the inductance of said inductive network are selected so as to be resonant at the frequency of said crystal.

9. A voltage controlled oscillator in accordance with claim 8 wherein said capacitive network includes the parallel arrangement of a capacitor and a first resistor and said inductive network includes the parallel arrangement of an inductor and a second resistor.

10. A voltage controlled oscillator in accordance with claim 1 further including a temperature compensating network coupled to said positive and negative feedback paths.

11. A voltage controlled oscillator in accordance with claim 1 wherein said current source includes first and second current source networks respectively coupled to said first and second conducting means.

12. A voltage controlled oscillator in accordance with claim 1 wherein said positive feedback path provides a first, primarily AC feedback signal to said first and second conducting means and said negative feedback path provides a second, AC and DC feedback signal to said current source.

13. In an integrated circuit voltage controlled oscillator including first and second conducting means coupled to a current source for the biasing thereof and coupled to an external crystal network and further including a current steering circuit coupled to said first and second conducting means for conducting complementary proportions of the respective signals from said first and second conducting means in establishing the oscillating frequency of said voltage controlled oscillator in response to a control voltage provided to said current steering circuit, the improvement comprising:

generating amplified positive and negative feedbacks signals at the output of said current steering circuit and providing said positive feedback signal to said first and second conducting means wherein the positive feedback signal initiates and sustains the oscillation of said voltage controlled oscillator and providing said negative feedback signal to said current source for stabilizing the biasing of said voltage controlled oscillator and its oscillating frequency.

* * * * *